United States Patent [19]

Harth et al.

[11] Patent Number: 5,620,743
[45] Date of Patent: Apr. 15, 1997

[54] COATING OR SURFACE TREATMENT OF SOLID PARTICLES BY MEANS OF A PLASMA FLUIDIZED BED

[75] Inventors: Klaus Harth, Altleiningen; Hartmut Hibst, Schriesheim; Wolfgang Mattmann, Limburgerhof, all of Germany

[73] Assignee: BASF Aktiengesellschaft, Ludwigshafen, Germany

[21] Appl. No.: 348,866

[22] Filed: Nov. 29, 1994

[30] Foreign Application Priority Data

Nov. 27, 1993 [DE] Germany ............... 43 40 480.4

[51] Int. Cl.$^6$ ................................. B05D 7/00
[52] U.S. Cl. ............... 427/213; 427/459; 427/460; 427/488; 427/489; 427/576; 427/578; 427/562
[58] Field of Search .................. 427/213, 569, 427/576, 578, 562, 460, 488, 489, 459

[56] References Cited

U.S. PATENT DOCUMENTS

| 4,685,419 | 8/1987 | Nakajima | 118/620 |
| 4,810,524 | 3/1989 | Nakayama | 427/213 |
| 4,948,485 | 8/1990 | Wallsten et al. | 204/164 |

FOREIGN PATENT DOCUMENTS 3617428  11/1987  Germany .

OTHER PUBLICATIONS

Derwent Accession, No. 75–203 91W (English abstract of SU–A 419 368) no date.
Derwent Accession, No. 95–012 086 (English abstract of JP–A 06 299 146) no date.
Journal De Physique IV, Colloque C1 (1991) Development of a Plasma Jetting . . . 429–438 no month.

Primary Examiner—Shrive Beck
Assistant Examiner—David M. Maiorana
Attorney, Agent, or Firm—Keil & Weinkauf

[57] ABSTRACT

Solid particles are coated in a fluidized bed by application of a gaseous coating agent from a plasma, wherein the plasma is generated outside the fluidized bed under 0.01–500 mbar, and the plasma-activated gas is passed into the fluidized bed, which is operated under 0.1–500 mbar, where a. the plasma is generated from the total amount of gaseous coating agent with or without another gas, or b. the plasma is generated from a portion of the gaseous coating agent with or without another gas, and the remaining portion is introduced directly into the fluidized bed, or c. the plasma is generated from another gas, and the total amount of gaseous coating agent is introduced directly into the fluidized bed.

7 Claims, 1 Drawing Sheet

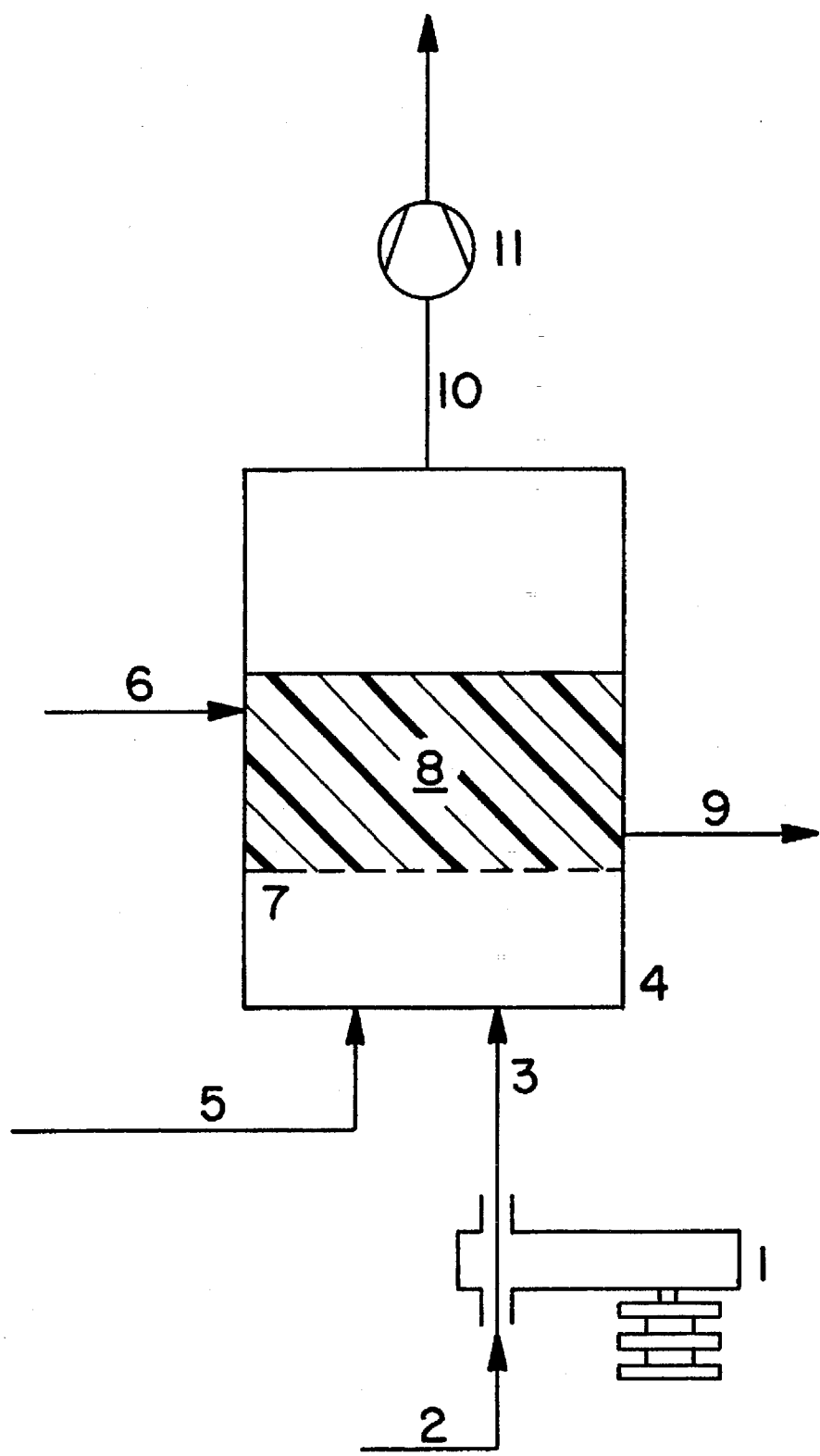

COATING OR SURFACE TREATMENT OF SOLID PARTICLES BY MEANS OF A PLASMA FLUIDIZED BED

FIELD OF THE INVENTION

The coating or surface treatment of solid particles by means of a plasma fluidized bed The present invention relates to an improved process for the coating or surface treatment of solid particles in a fluidized bed by the application or action of a gaseous coating or treating agent, respectively, from a plasma.

BACKGROUND OF THE INVENTION

Coating of solid particles may be advisable, for example, for metallic magnetic pigments in order to increase the corrosion resistance. For this purpose, the metallic solid particles are coated with a thin carbon-containing layer. The coating of active substances also represents a typical area of use. It is possible in this way, for example, to achieve delayed release of the active substance or improved stability.

It is possible by surface treatment of the solid particles to influence, for example, their wettability. Thus, the surface of colored pigments can be roughened by the action of oxygen, which facilitates dispersion of the colored pigments.

These processes must meet certain requirements, of which uniform coating or treatment of the surface of the solid particles should be mentioned first. In this respect as a rule only small variations are permissible, and the elaboration of the apparatus and process is correspondingly high in order to comply with this and similar objectives in the most economic way industrially.

In a known process, aluminum particles are coated with a carbon-containing layer in a fluidized bed into which a plasma torch projects ((T. Kojima et al., Journal De Physique IV, Colloque C2 (1991), "Development Of A Plasma Jetting Fluidized Bed Reactor", pp 424–436). In this case, argon is used as carrier gas and a mixture of methane and hydrogen is used as coating agent (page 430). The plasma is generated by a plasma torch which is operated with a constant voltage and projects directly into the fluidized bed. The plasma generation produces free radicals from the methane, which bring about a free-radical chain reaction to give larger organic molecules which in turn eventually form a crosslinked organic layer on the aluminum particles. However, owing to the direct action of the plasma torch on the fluidized bed in the process, very high coating temperatures are produced so that only thermally stable substrates such as metal or ceramic powders can be coated.

A process in which solid particles are coated in a low-pressure process with the aid of a cascade arc discharge device operated at constant voltage is also known (U.S. Pat. No. 4,948,485). The coating in this case is achieved by passing a stream of particles past the arc discharge device (column 6, lines 8 to 27). Although the reduction in pressure to below about 0.1 bar (column 2, lines 54 to 66) makes it possible to reduce the coating temperature, the particles can be exposed to the action of the arc discharge device for only a short time, which greatly restricts the possible uses of this process. In addition, in this process, it is extremely difficult to obtain uniform coating of the particles.

DE-A 36 17 428 describes a process in which the components are coated in a fluidized bed operated at atmospheric pressure, with, if appropriate, hydrogen being preheated by means of a plasma torch.

SUMMARY OF THE INVENTION

It is an object of the present invention to remedy the said disadvantages and to find an improved process which allows homogeneous coating or surface treatment of heat-sensitive solid particles, and where sufficiently long residence times of the solid particles in the activated process gas should be possible.

We have found that this object is achieved by a process for coating solid particles in a fluidized bed by application of a gaseous coating agent from a plasma, wherein the plasma is generated outside the fluidized bed under 0.01–500 mbar, and the plasma-activated gas is passed into the fluidized bed, which is operated under 0.1–500 bar, where a. the plasma is generated from the total amount of gaseous coating agent with or without another gas, or b. the plasma is generated from a portion of the gaseous coating agent with or without another gas, and the remaining portion is introduced directly into the fluidized bed, or c. the plasma is generated from another gas, and the total amount of gaseous coating agent is introduced directly into the fluidized bed.

The present invention also relates to a process for the surface treatment of solid particles.

BRIEF DESCRIPTION OF THE DRAWINGS

FIG. 1 is a schematic view illustrating an example of the apparatus used in the practice of the invention.

DETAILED DESCRIPTION OF THE INVENTION

The generation of the plasma introduces the energy necessary for forming free radicals and breakdown products thereof, which in turn eventually bring about, for example in the case of coating, the formation of a crosslinked layer on the solid particles. In this case the coating process takes place in a fluidized bed which is separate from the generation of the plasma, which means that the solid particles are advantageously exposed to only relatively low temperatures.

The temperatures in the generation of the plasma are normally very high and may reach about 1000° C. The separation of the fluidized bed from the generation of the plasma, and the reduction in pressure mean that the solid particles contained therein are exposed to distinctly lower temperatures. This effect can be further enhanced in a preferred embodiment by reducing the pressure to about 0.01 to 100 mbar for generating the plasma, and about 0.1 to 100 mbar in the fluidized bed. It is possible in this way to carry out coatings in the fluidized bed at temperatures as low as about 20° C. A preferred temperature range for the process extends from about 20° to 250° C., particularly preferably 40° to 200° C. Furthermore, the process is also very suitable for applications at higher temperatures as occur in conventional plasma-assisted coating processes. The plasma generation can take place within a portion or the total amount of the gaseous coating agents. It is furthermore possible to generate the plasma in a different gas, which is subsequently passed, separate from the coating agent, into the fluidized bed and transfers the free radicals to the coating agent.

The same applies analogously to the surface treatment of solid particles, in which case a required alteration in the surface properties of the solid particles is achieved in the presence of treatment gases such as oxygen.

The process for coating solid particles is described in detail hereinafter with the aid of the diagram in the figure.

The plasma required for the process is produced with the aid of a commercial apparatus (1), with the gas to be activated being supplied through line (2). The plasma is, as a rule, produced by excitation by means of electromagnetic waves.

In a preferred embodiment, the plasma is generated, for example, by a magnetron in a frequency range from about 0.5 to 5 GHz, particularly preferably at 2.45 GHz. A particularly efficient and stable excitation is achieved if a standing wave is produced in a conventional manner in a downstream hollow conductor. In another preferred arrangement, the plasma can be generated by inductive coupling inside a coil. In this case, a frequency of about 5 kHz to 50 MHz is advisable.

The activated gas can be composed of the coating agent or another gas, and it enters the fluidized bed reactor (4) through line (3). Other gases, for example inert carrier gases or coating agents, can be supplied to the fluidized bed reactor through line (5). The untreated solid particles are added through line (6). Inside the fluidized bed reactor (4) there is, on top of the inflow plate (7), a fluidized bed (8) which is predominantly composed of the solid particles employed. It is possible where appropriate to dispense with the inflow plate by known design measures such as giving the fluidized bed reactor a conical shape. The breakdown products of the coating agent generated by the plasma are deposited on the solid particles, and the coated particles are removed from the fluidized bed reactor through line (9).

The gas stream is removed from the fluidized bed reactor by a pump (11) through line (10).

The stability of the plasma, the heat stress on the particles and the homogeneity and quality of the coating are influenced by the pressure and gas flow conditions within the plasma and in the fluidized bed. In a preferred embodiment of the process, the pressure for generating the plasma is about 0.01 to 100 mbar, particularly preferably 1 to 20 mbar. In this case it is advisable for the pressure within the fluidized bed to be about 0.1 to 100 mbar, in particular 1 to 20 mbar. A higher pressure may lead to a large rise in temperature in the plasma source and subsequently in the material to be coated within the fluidized bed.

It may be advisable, in order to reduce the temperature further, to cool the gas during generation of the plasma. It is possible to employ for this purpose, for example, jacketed silica tubes charged with a suitable gaseous or liquid coolant. The choice of the suitable coolant must take account not only of the temperature conditions prevailing but also of the need for it to absorb little of the electromagnetic waves. Air is a suitable coolant, for example.

It is possible to supply a plurality of activated and non-activated gases to the fluidized bed reactor. It is possible in this case to convert the coating agent into the plasma state only in the fluidized bed reactor by adding another, activated gas.

Gases can be supplied to the fluidized bed reactor in various ways, from above, from the sides and from below. It may, moreover, be advisable to have a plurality of supply lines to simplify control. However, it is necessary for an appropriately dimensioned gas stream to be supplied from below to produce the fluidized bed.

The novel process can be used over a wide temperature range. It is particularly advantageously applied to heat-sensitive products which must not be exposed to excessively high temperatures in order to retain their quality.

Preferred applications of the novel process are the coating of substrates such as granules or fibers composed of thermoplastic or thermoset polymers, pigments or granules composed of organic dyes or active substances. The novel process also proves advantageous for the coating of relatively thermostable substrates because, owing to the low temperatures and pressures, the economics and safety of the process can be improved. Examples of suitable applications are the coating of powders of metallic or ceramic materials, inorganic colored and magnetic pigments, mineral fillers, glass or carbon fibers, fertilizer particles or catalyst supports.

The use of the process may be advisable, for example, to alter the surface properties of the solid particles in such a way that further processing thereof is facilitated, as may be the case for fillers for plastics. The coating of solid particles with active layers is also a typical application, by which means it is possible to influence, for example, the optical, magnetic or catalytic properties.

The coating agent employed depends on the desired type of coating. Suitable coating agents are in principle all organic compounds which are gaseous under the reaction conditions, in particular saturated and unsaturated hydrocarbons with up to 8 carbon atoms such as methane, ethane, propane, butane, isobutane, hexane, cyclohexane, octane, ethylene, propylene, 1-butene, 2-butene and butadiene. Also suitable are, for example, $C_1$–$C_4$-alkanols, silanes, organosilicon compounds such as hexamethyldisiloxane and organometallic compounds such as metal carbonyls, metal alkyls and titanamides, as well as mixtures of these and other compounds.

When the plasma is generated, the gaseous coating agents form free radicals which initiate chain reactions in the fluidized bed during the coating process. The free radicals eventually produce a coherent crosslinked layer on the surface of the particles to be coated. The total amount of the coating agents can be supplied to the fluidized bed via the plasma-generating apparatus according to the three embodiments (a) to (c), and other gases such as nitrogen or oxygen or inert gases, eg. neon or argon, can also be used. However, in the final analysis it is only essential that a certain number of free radicals of any atoms or molecules is generated in the plasma and then enters the fluidized bed and initiates the chain reaction with the remainder or total amount of the coating agent, which can be introduced directly into the fluidized bed.

The same applies analogously to the process for the surface treatment of solid particles, but in this case as a rule other gases such as oxygen, nitrogen and/or inert gases are used. Furthermore, suitable gases have proved to be those which contain oxygen and/or nitrogen in bound form. The action of oxygen can, for example, cause roughening of the surface of the solid particles, which may facilitate subsequent wetting with other materials.

In a preferred embodiment, the pressure for generating the plasma is reduced to about 0.01 to 100 mbar, and that in the fluidized bed is reduced to about 0.1 to 100 mbar. It is possible in this way to carry out surface treatment at temperatures as low as about 20° C.

The process according to the invention for the coating or surface treatment of solid particles can be carried out at low temperatures because of the separation of plasma generation and fluidized bed. It is therefore possible to employ even relatively heat-sensitive substrates in this process.

The novel process also proves advantageous for more thermostable substrates because the low temperatures make it possible to improve the economics and safety of the process.

Since the coating of the solid particles takes place in a fluidized bed, the residence time of the solid particles can be varied over a wide range and, furthermore, treatment under mild conditions is ensured.

EXAMPLE

Production of a slow release verapamil product

Solid particles about 1 mm in size of the pharmaceutical active substance verapamil (alpha-isopropyl-alpha-((N-methyl-N-homoveratryl)-gamma-aminopropyl)-3,4-dimethoxyphenylacetonitrile hydrochloride) were introduced into a conical laboratory reactor with a height of about 200 mm and a diameter of from 10 to 26 mm. A total of about 3 g of solid particles was added.

The reactor was operated at about 80° C. under about 2–3 mbar. Plasma-activated argon generated by microwaves was passed from below into the reactor, and ethylene was introduced from above. The volume flows under standard conditions were about 730 ml/min argon and 1650 ml/min ethylene. The test lasted 30 minutes.

The solid particles were coated with a polymer layer during the test. To determine the effect on the release the rate of release was determined by the USP XXII (United States Pharmacopeia) paddle method. This method essentially comprises dissolving the solid particles according to the invention in a stirred acidic solution. By measurements of the concentration in removed samples the proportion of active substance dissolved as a function of time is determined. The results were as follows:

| Time [min] | Release [%] |
|---|---|
| 20 | 53 |
| 40 | 90.6 |
| 60 | 96.5 |
| 120 | 98.5 |
| 180 | 100 |
| 240 | 100 |

We claim:

1. A process for coating solid particles in a fluidized bed by application of a gaseous coating agent from a plasma, wherein the plasma is generated outside the fluidized bed under 0.01–500 mbar, and the plasma-activated gas is passed into the fluidized bed, which is operated under 0.1–500 mbar, where a. the plasma is generated from the total amount of gaseous coating agent with or without another gas, or
   b. the plasma is generated from a portion of the gaseous coating agent with or without another gas, and the remaining portion is introduced directly into the fluidized bed, or
   c. the plasma is generated from another gas, and the total amount of gaseous coating agent is introduced directly into the fluidized bed.

2. A process as defined in claim 1, wherein the gaseous coating agent is selected from the group consisting of hydrocarbons, alkanols, silanes, organosilicon, organometallic compounds and mixtures thereof.

3. A process for the surface treatment of solid particles in a fluidized bed by the action of a gaseous treating agent from a plasma, wherein the plasma is generated outside the fluidized bed under 0.01–500 mbar, and the plasma-activated gas is passed into the fluidized bed, which is operated under 0.1–500 mbar, where a. the plasma is generated from the total amount of gaseous treating agent with or without another gas, or
   b. the plasma is generated from a portion of the gaseous treating agent with or without another gas, and the remaining portion is introduced directly into the fluidized bed, or
   c. the plasma is generated from another gas, and the total amount of gaseous treating agent is introduced directly into the fluidized bed.

4. A process as defined in claim 3, wherein the gaseous treating agent is selected from the group consisting of oxygen, an oxygen-containing compounds, nitrogen, a nitrogen-containing compound and a noble gas and mixtures thereof.

5. A process as defined in claim 1, wherein the plasma is generated by means of an alternating voltage with a frequency of from 5 kHz to 5 GHz.

6. A process as defined in claim 1, wherein the plasma of the coating agent is generated at a pressure in the range from 0.01 to 100 mbar, and the fluidized bed is operated at a pressure in the range from 0.1 to 100 mbar.

7. A process as defined in claim 3, wherein the plasma of the agent is generated at a pressure in the range from 0.01 to 100 mbar, and the fluidized bed is operated at a pressure in the range from 0.1 to 100 mbar.

* * * * *

UNITED STATES PATENT AND TRADEMARK OFFICE
CERTIFICATE OF CORRECTION

PATENT NO.: 5,620,743

DATED: April 15, 1997

INVENTOR(S): HARTH et al.

It is certified that error appears in the above-identified patent and that said Letters Patent is hereby corrected as shown below:

Column 6, claim 7, line 43, "the agent" should be --the treating agent--.

Signed and Sealed this

Eighth Day of July, 1997

Attest:

BRUCE LEHMAN

Attesting Officer

Commissioner of Patents and Trademarks